(12) United States Patent
Waayers

(10) Patent No.: US 7,571,068 B2
(45) Date of Patent: Aug. 4, 2009

(54) MODULE, ELECTRONIC DEVICE AND EVALUATION TOOL

(75) Inventor: Thomas Franciscus Waayers, Eindhoven (NL)

(73) Assignee: NXP B.V., Eindhoven (NL)

( * ) Notice: Subject to any disclaimer, the term of this patent is extended or adjusted under 35 U.S.C. 154(b) by 368 days.

(21) Appl. No.: 10/524,458

(22) PCT Filed: Jul. 17, 2003

(86) PCT No.: PCT/IB03/03261

§ 371 (c)(1),
(2), (4) Date: Feb. 10, 2005

(87) PCT Pub. No.: WO2004/017083

PCT Pub. Date: Feb. 26, 2004

(65) Prior Publication Data

US 2005/0268193 A1  Dec. 1, 2005

(30) Foreign Application Priority Data

Aug. 14, 2002 (EP) ................................. 02078366

(51) Int. Cl.
*G01R 27/28* (2006.01)
*G06F 3/00* (2006.01)
(52) U.S. Cl. ........................................ 702/120; 710/48
(58) Field of Classification Search ................ 702/120, 702/117, 108, 118, 121; 700/53, 1; 710/1, 710/20, 52, 65, 37, 5, 14, 18, 36, 48, 58; 714/30, 724, 726, 727, 729, 735
See application file for complete search history.

(56) References Cited

U.S. PATENT DOCUMENTS 4,000,464 A * 12/1976 Nussel ....................... 324/772

(Continued)

OTHER PUBLICATIONS de Jong et al., Testing and Programming Flash Memories on Assemblies During High Volume Production, Oct. 30-Nov. 1, 2001, ITC International Test Conference, pp. 470-479.*

(Continued)

*Primary Examiner*—Michael P. Nghiem
*Assistant Examiner*—Toan M Le

(57) ABSTRACT

A module (100) has test controller (140) for evaluating a functional block (120). The test controller (140) includes a first register (142) coupled between an input pin (162) and an output pin (164) from a plurality of pins (160) and a second register (144) coupled to the first register (142) for capturing an update of the content of the first register (142) responsive to an update signal from a decoder (170). The second register (144) is further arranged to generate evaluation control signals (145).

The test controller further includes dedicated control circuitry including a plurality of logic gates (180) and a first logic gate (182). The plurality of logic gates is arranged to decode the content of the first register (142) and provide the first logic gate (182) with a resulting gating signal for blocking the update of the second register (144). Consequently, the dedicated control circuitry is able to prevent undesired changes in the module (100) during an evaluation mode of for instance another module.

16 Claims, 8 Drawing Sheets

U.S. PATENT DOCUMENTS

| | | | |
|---|---|---|---|
| 4,928,278 A * | 5/1990 | Otsuji et al. | 714/700 |
| 5,396,501 A * | 3/1995 | Sengoku | 714/727 |
| 5,983,379 A * | 11/1999 | Warren | 714/727 |
| 6,055,649 A * | 4/2000 | Deao et al. | 714/30 |
| 6,178,534 B1 * | 1/2001 | Day et al. | 714/745 |
| 6,499,124 B1 * | 12/2002 | Jacobson | 714/727 |
| 6,553,527 B1 * | 4/2003 | Shephard, III | 714/733 |
| 6,728,901 B1 * | 4/2004 | Rajski et al. | 714/30 |
| 6,851,079 B1 * | 2/2005 | Hergott | 714/724 |
| 6,941,494 B1 * | 9/2005 | Andreev et al. | 714/718 |
| 6,961,871 B2 * | 11/2005 | Danialy et al. | 714/30 |
| 6,988,230 B2 * | 1/2006 | Vermeulen et al. | 714/727 |
| 7,107,503 B2 * | 9/2006 | Balzer | 714/727 |
| 7,120,843 B2 * | 10/2006 | Whetsel | 714/726 |

OTHER PUBLICATIONS

Zhu et al., The Algorithm of Inserting Boundary-Scan Circuit Automatically, 1998 IEEE, pp. 527-531.*

Oakland, S., Combining IEEE Standard 1149.1 With Reduced-Pin-Count Component Test, 1991 IEEE VLSI Test Symposium, pp. 78-84.*

* cited by examiner

MODULE, ELECTRONIC DEVICE AND EVALUATION TOOL

The present invention relates to a module comprising a functional block and a test controller for controlling the functional block in an evaluation mode of the module, the test controller comprising a plurality of pins including an input pin and an output pin; a first register coupled between the input pin and the output pin for receiving a bit pattern via the input pin and outputting the bit pattern via the output pin; and a second register coupled to the first register for capturing a further bit pattern responsive to an update signal. The invention also relates to an electronic device comprising a plurality of modules, and to an evaluation tool for evaluating such an electronic device.

The increasing complexity of electronic devices, e.g. very large scale integration (VLSI) circuits like systems-on-chip (SoC) or multi-chip arrangements like multi-chip modules (MCMs) or printed circuit boards (PCBs), more and more leads to a modular design approach for such devices. The modules that are integrated in such devices may be obtained from external parties, e.g. hard or soft core vendors, that are specialized in designing modules with a specific functionality, e.g. digital signal or arithmetic processing. The fact that the various modules in the electronic device may come from various sources is one of the reasons why the debugging of the electronic devices is becoming more important. During debug, the functional behavior of the modules of the electronic device is evaluated to determine whether the various modules operate and cooperate correctly.

To enable an evaluation mode, e.g. a test or debug mode, of the module, such a module will be equipped with a test controller, which may be a IEEE 1149.1 compliant test controller, e.g. a JTAG Test Access Port (TAP) controller. Typically, test controllers of the modules will be linked together in a daisy-chainlike arrangement to enable the serial shifting of bit patterns, e.g. test controller instructions and test data, through the chain of modules. The interconnection of the test controllers is preferred because the separate access of individual modules is very difficult if not impossible. The appropriate shift registers of the test controllers are filled with their respective bit patterns that are typically copied into an update or shadow register in an update cycle of the evaluation mode. This way, new data may be shifted into the shift registers in a next shift cycle of the evaluation mode with the data in the update registers being unaffected.

An example of such an arrangement is disclosed in a paper of the conference journal 'Proceedings of the international test conference (ITC)' 2000, p. 628-637, "Considerations for Implementing IEEE 1149.1 on System-on-a-Chip Integrated Circuits" by Steven F. Oakland, and in particular in FIG. 7 of the paper. This figure shows an electronic device having a daisy chain of serially connected IEEE 1149.1 compliant TAPs of a number of embedded cores in parallel with a master TAP. A dedicated debug instruction can be loaded into the selected TAPs to debug the module under the control of the selected TAP.

One of the problems with such arrangements is that usually only a single module can be debugged at the same time to keep the software task feasible. This is typically done by means of dedicated debug software. However, to be able to feed the targeted module, i.e. the module under debug, with the desired control and data bit patterns, the whole concatenation of scan chain registers has to be updated. This may also effect the state of the untargeted modules because the dedicated debug software has only knowledge of the access path, i.e. the concatenated scan register chain, but lacks knowledge about the current states of the other modules. Therefore, the states of the other modules can change as a result of an update action on the module under debug because undefined bit patterns can be loaded into the update registers. Changing the state of a surrounding module is likely to change the signals coming from such a module. This can have detrimental effects on the reliability of the debug results, because these results are likely to depend on external signals, e.g. the communication from surrounding modules, as well.

Amongst others, it is an object of the present invention to provide a module with a test controller that can maintain the present state of the module during an update action.

The invention is defined by the independent claims. The dependent claims define advantageous embodiments.

The present invention is based on the realization that especially during a debug mode, but possibly also during a test mode, it can be desirable to freeze the content of a register to maintain a state of the associated module. According to the present invention, this has been realized by including dedicated control circuitry for blocking the update signal responsive to the bit pattern, e.g. a data pattern or an instruction. The second register that is blocked this way may be the register that is arranged to capture the bit pattern of the first register or may be a register arranged to capture a bit pattern from another shift register.

In an embodiment of the invention, the dedicated control circuitry comprises a first logic gate having a first input for receiving the update signal; a second input coupled to the first register for receiving the bit pattern; and an output coupled to the second register. In this embodiment, the bit pattern, which can be a single bit, is directly fed to the first logic gate, e.g. an AND, NAND or NOR gate or a switch like a transistor, which depending on the value of the bit pattern blocks the transmission of the update signal to the second register. This has the advantage that a negligible amount of area overhead is introduced by the addition of the dedicated control circuitry, and that very small bit patterns can be used to block the update signal, which is advantageous in terms of required data communication.

In a further embodiment of the present invention, the dedicated control circuitry further comprises a plurality of logic gates coupled between the first register and the second input for providing the second input with the bit pattern in a modified form. This has the advantage that a dedicated bit pattern can be provided to the module in the form of an instruction, which the plurality of logic gates operating as a hardware decoder of the instruction. Such an instruction may be added to a set of existing test or debug instructions, e.g. a IEEE 1149.1 compliant instruction set, which will mean that the required dedicated debug software packages that use such an instruction set can apply the instruction to the modules not being debugged, thus increasing the stability of the various modules and improving the debug reliability.

It is a further advantage if the test controller further comprises a multiplexer having a control terminal, a first input, a second input, and an output coupled to the output pin; a third register coupled between the input pin and the first input of the multiplexer; and a no-update bypass register coupled between the input pin and the second input of the multiplexer; the control terminal of the multiplexer being responsive to at least a part of the bit pattern.

In some situations, freezing the second register, e.g. the instruction update register, has to be combined with a well-defined data path through the module in evaluation mode to enable loading a chain of module in a scan mode of the evaluation. The addition of a fixed-length bypass register ensures the presence of such a data path.

It is yet a further advantage if the dedicated control circuitry comprises a second logic gate having a first input coupled to the plurality of logic gates for receiving the bit pattern in the modified form; a second input for receiving a further update signal; and an output coupled to the third register, the third register being responsive to the further update signal.

This arrangement ensures that the content of the third register is also frozen when the update of the second register is prevented. This is particularly useful when the second register carries an instruction and the third register carries data associated with that instruction, and both the instruction and the data are required to maintain the module in a stable state, or to mask any action coming from a non-active test controller.

It is another advantage if the output path comprises a data storage element responsive to the update signal for storing the bit pattern in the modified form. The use of a data storage element, e.g. a dedicated register or at least a single flip-flop, ensures that the bit pattern is present in a stable form throughout the whole period of time between two successive update signals.

According to another embodiment of the present invention, the test controller further comprises a further multiplexer having a first input, a second input, an output and a control terminal coupled to an output of the second register; a first further register coupled between the input pin and the first input of the further multiplexer; a second further register being responsive to the update signal, the second further register having at least an input coupled to the first register; and a conductor coupled between the input pin and the second input; the first register being coupled between the output of the multiplexer and the output pin; and the second input of the first logic gate being coupled to the first register via the second register.

This arrangement is also particularly useful to address another problem associated with prior art arrangements like the one disclosed by Steven F. Oakland. Evaluation, e.g. debugging, usually involves a high density of data traffic between the evaluation equipment and the module under evaluation. This can become a serious bottleneck in terms of the total evaluation time required if the total concatenation of shift registers becomes very long, because the time required to insert a new bit pattern into the module under evaluation is dominated by the length of the concatenation. The embodiment of the present invention solves this problem by providing a bypass around the first further register, i.e. the shift register in the concatenation, once the second further register has been brought in the desired state and the updates of the second further register are prevented. This way, the length of the shift register concatenation can be significantly reduced, which enables the execution of a higher number of evaluation actions per time unit, e.g. more extensive testing or debugging, in comparison to the prior art arrangements, which may be used to either reduce total evaluation time or improve the quality of the evaluation when the same total amount of time is used compared to the prior art arrangements.

Advantageously, the second further register is responsive to a reset signal. This way, this register can be readily returned to an initial state. Optionally, the second register is also responsive to this reset signal, which can be used to return the first further register to the concatenation of shift registers.

It is yet another advantage if the second input of the first logic gate is coupled to the second register through a further logic gate, the further logic gate further being coupled to the first register.

This arrangement ensures that the content of the second further register is already frozen when entering the bypass mode of the test controller to ensure the mode that was loaded before loading the bypass mode into the first register.

It is a further advantage if the dedicated control circuitry further comprises a plurality of logic gates responsive to the second register, the plurality of logic gates having their inputs coupled to the second further register and having at least an output coupled to the control terminal of the further multiplexer.

The plurality of logic gates are arranged to decode the content of the second further register and generate a plurality of evaluation control signals, including the control signal for the control terminal of the second multiplexer. This increases the flexibility in the evaluation mode, because of wide range of control signals can be generated from a few dedicated bit patterns.

Now, a further aspect of the present invention is realized by the electronic device of claim 11.

Such an electronic device will have improved evaluation characteristics, because the various surrounding modules can be kept in a stable state during evaluation of a module, which provides more reliable interaction between the modules involved. This provides a better quality of evaluation for the electronic device, which results in a more reliable electronic device being marketed. In addition, the use of bypass facilities according to the present invention will reduce the duration of the evaluation, which may be used to reduce evaluation time and cost leading to a cheaper electronic device, or may be used to extend the evaluation in a given time span to yield a better evaluated and hence more reliable electronic device.

Yet a further aspect of the present invention is realized by the evaluation tool of claim 12.

The extension of a bit pattern set of such an evaluation tool, e.g. debug or test software or debug or test hardware having such a bit pattern set internally stored, by including a bit pattern of the present invention in the tool improves the quality of the evaluation tool. The evaluation results of the tool become more reliable because of the increased stability of the electronic device under evaluation and the total evaluation time of the electronic device may be reduced when the length of the shift register concatenation can be reduced by using the bit pattern. These advantages improve the marketability of the evaluation tool.

The invention is described in more detail and by way of non-limiting examples with reference to the accompanying drawings, wherein.

Corresponding reference numerals will have similar meanings unless explicitly stated otherwise.

Figure 1:
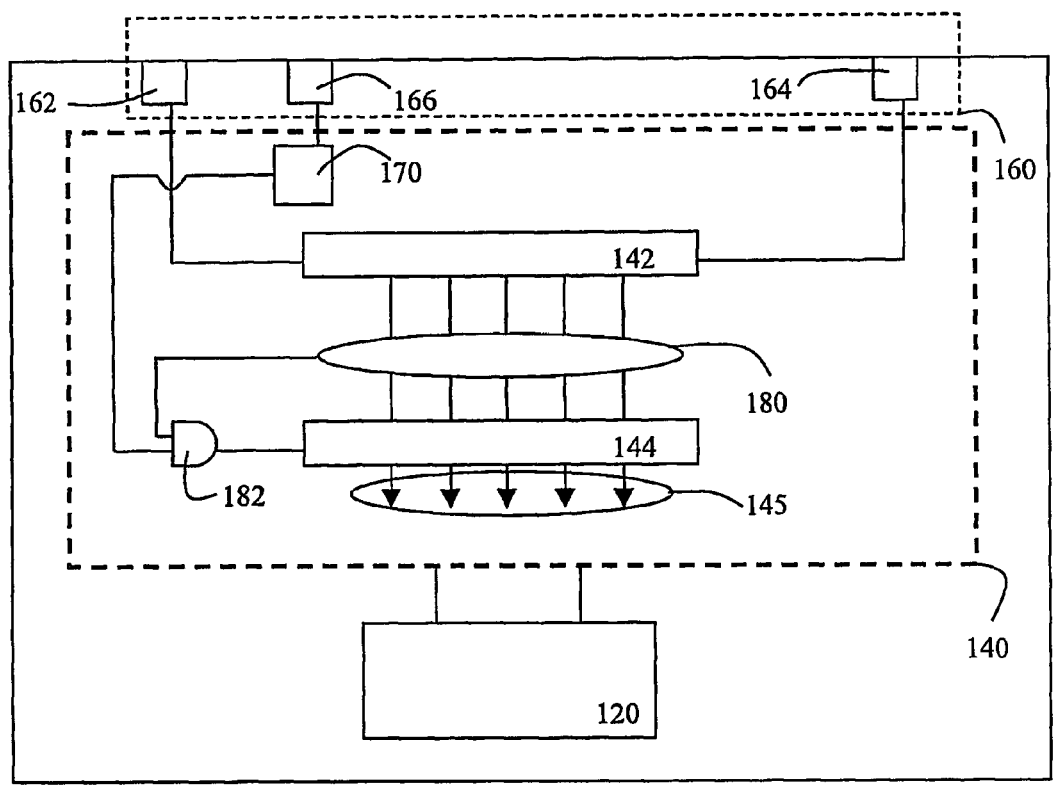
FIG. 1 depicts an embodiment of a module according to the present invention.

In FIG. 1, module 100 has a functional block 120, which is coupled to a test controller 140. Test controller 140 receives test signals from a plurality of pins 160, e.g. a test access port (TAP). The plurality of pins 160 include an input pin 162 and an output pin 164 for receiving and sending data, e.g. bit patterns, from and to external units, e.g. other modules or the tester. The test module 140 includes a first register 142 coupled between the input pin 162 and the output pin 164. First register 142 may be an instruction shift register or a data shift register. The test module 140 further has a second register 144 for capturing the content of first register 142 responsive to an update signal. The update signal may be received directly from a further pin not shown from the plurality of pins 160 or from a decoder 170 coupled to test mode select pin 166 from the plurality of pins 160. The decoder 170 may be a IEEE 1149.1, i.e. boundary scan test (BST), compliant TAP controller. The second register 144 is arranged to generate test control signals 145 for controlling the further test arrangement not shown of module 100.

First register 142 has outputs that are connected to inputs of second register 144. In addition, the outputs are also fed into a plurality of logic gates 180, which serves as decode circuitry to decode the content of first register 142. The plurality of logic gates 180, which is a part of dedicated control circuitry, generates a gating signal, i.e. alters the bit pattern from first register 142 to a bit pattern in a modified form, at a predefined content of the first register, e.g. when a dedicated no-update instruction is encountered. The gating of the update signal that updates second register 144 is realized by a logic gate 182, which is another part of the dedicated control circuitry and has a first input coupled to decoder 170; for receiving the update signal and a second input for receiving the gating signal from the plurality of logic gates 180. Logic gate 182 is depicted as an AND gate, but it will be obvious to those skilled in the art that other logic gates including switches, e.g. transistors, can be used to obtain similar functional behavior. This arrangement enables the freezing of the content of second register 144 and the associated control signals. Consequently, the evaluation mode of module 100 can be kept in a stable state as long as the dedicated instruction is loaded into the first register 142 prior to the occurrence of the update signals generated by decoder 170.

Figure 2:
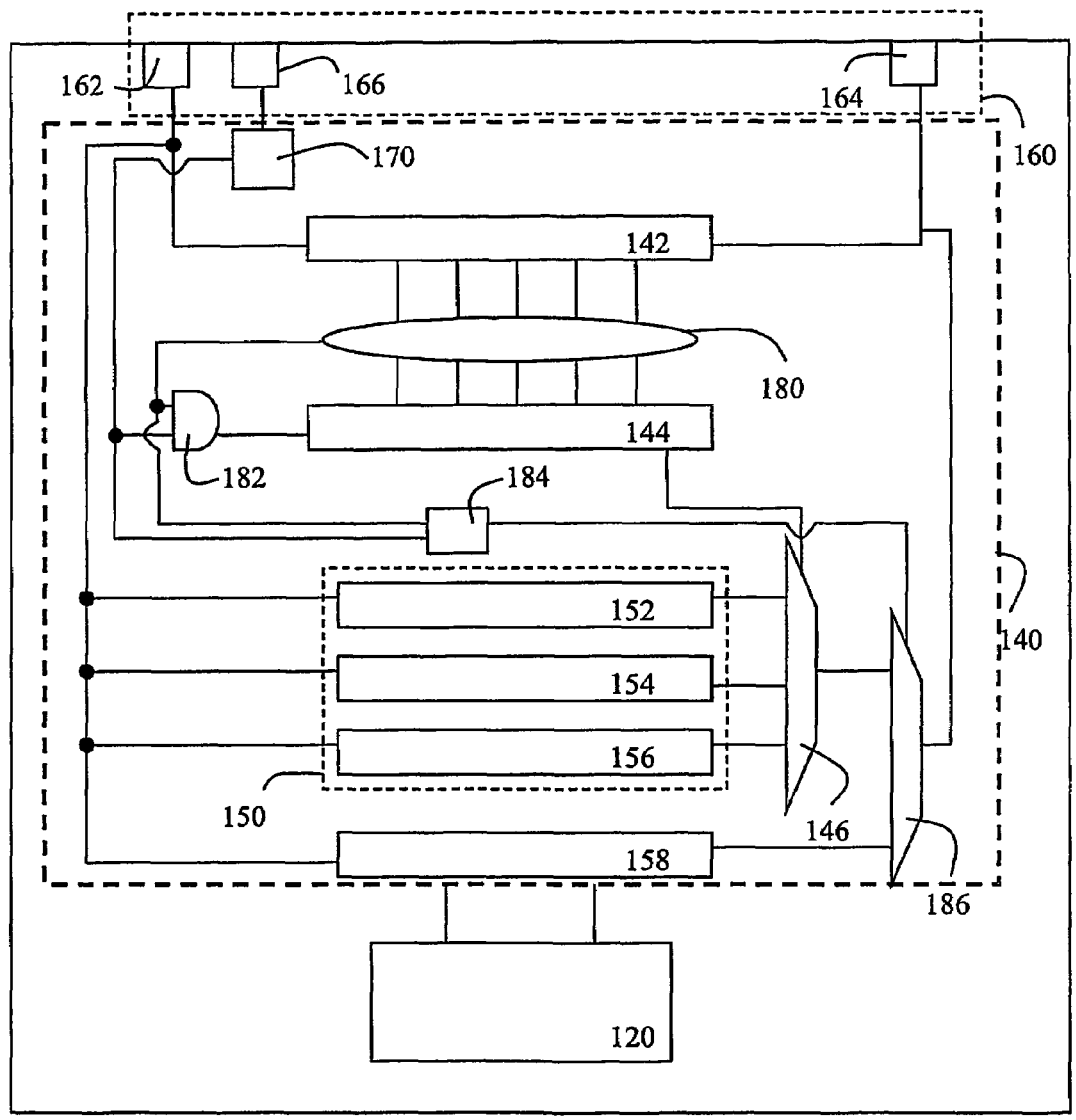
FIG. 2 depicts another embodiment of a module according to the present invention.

Now, the following Figs. will be described in backreference to FIG. 1 and its detailed description. In FIG. 2, the test controller 140 of module 100 is extended with a plurality of further registers 150, here including a third register 152, a fourth register 154 and a fifth register 156 by way of non-limiting example only, each having their input coupled to the input pin 162 and their output coupled to the output pin 164 via a first multiplexer 146 under control of second register 144. It is emphasized that a plurality of registers 150 is used by way of example, the plurality of registers 150 may in fact consist of a single register, i.e. third register 152.

In addition, the test controller 140 includes a no-update bypass register 158, which is coupled between the input pin 162 and a multiplexer 186. Multiplexer 186 has another input connected to the output of multiplexer 146, and has its output connected to the output pin 164. It is emphasized that, although not shown in FIG. 2, the output of multiplexer 186 and the output of first register 142 may be coupled to the output 164 via a multiplexer. The multiplexer 186 is controlled by the gating signal that is generated by the plurality of logic gates 180 of the dedicated control circuitry. When the plurality of logic gates 180 decodes a no-update instruction in the first register 142, the gating signal will switch the path through multiplexer 186 to the no-update bypass register 158.

This way, when the evaluation state of module 100 is kept constant, a well-defined data path through the module 100 via the no-update bypass register 158 is present. Such a well-defined data path may be necessary if the evaluation software of a specific module needs to include the information of the length of the scan chains through the other modules in the chain of modules. Preferably, the size of the no-update bypass register is a single bit. In addition, a data storage element 184 is preferably included in the output path from the plurality of logic gates 180 to the control terminal of multiplexer 186. This data storage element 184, which is responsive to the update signal from decoder 170 or from a further pin not shown from the plurality of pins 160, stores the gating signal between two consecutive update signals. Consequently, the appropriate path through multiplexer 186 is kept stable in between the consecutive update signals.

Alternatively, multiplexer 186, no-update bypass register 158 and data storage element 184 can be omitted when a register from the plurality of bypass registers 150 is a bypass register. In this alternative embodiment, the no-update instruction or data pattern that is stored in second register 144 must include the appropriate bits for selecting the correct path through multiplexer 146, e.g. the path that selects the bypass register from the plurality of registers 150. Multiplexer 146 may have its output directly coupled to the output pin 164. The data stored in second register 144 is stable in between consecutive update signals from decoder 170 or the further pin not shown from the plurality of pins 160, which ensures the stability of the data path through multiplexer 146 in between the consecutive update signals.

Figure 3:
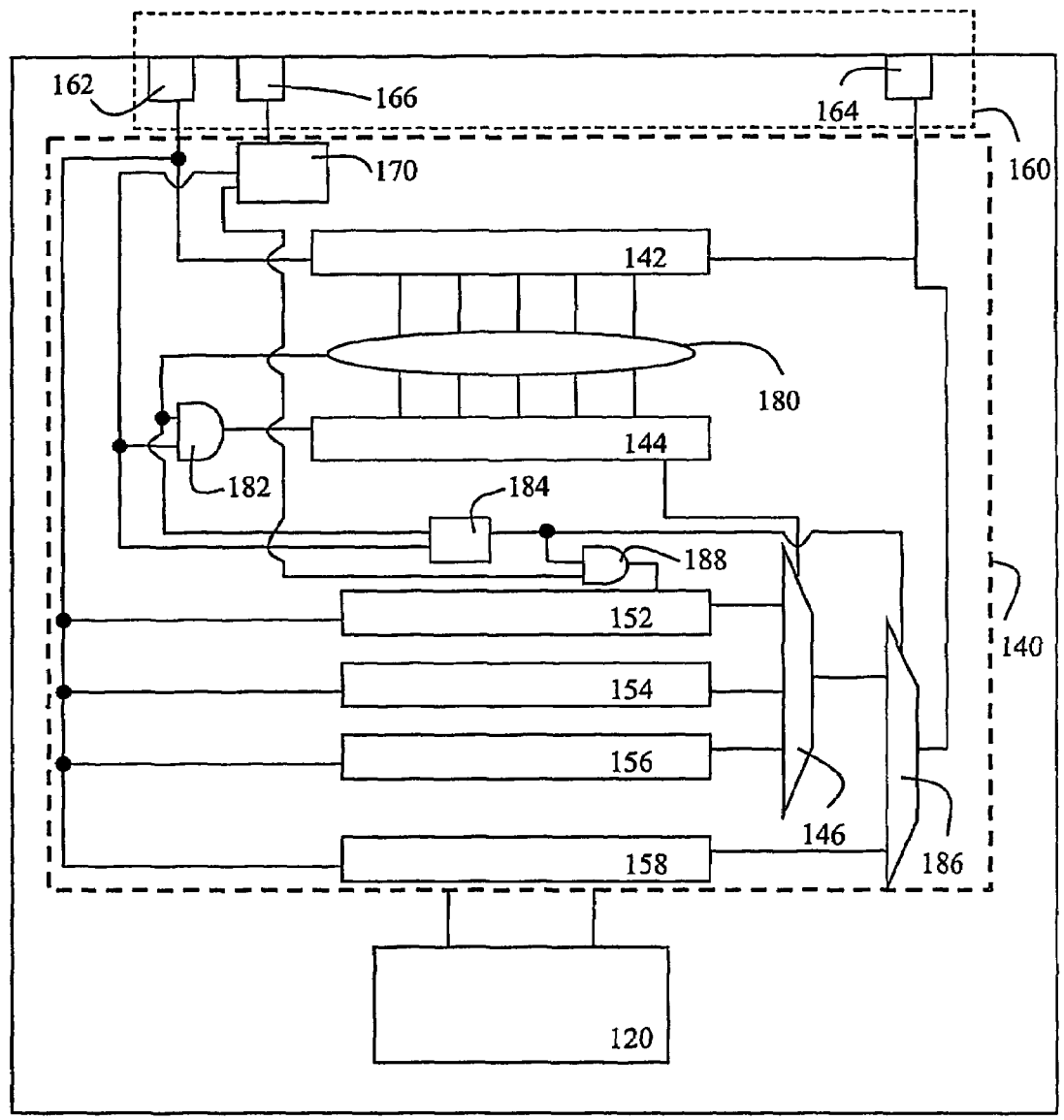
FIG. 3 depicts yet another embodiment of a module according to the present invention.

Now, FIG. 3 is described in backreference to FIG. 2 and its detailed description. In FIG. 3, the test controller 140 is extended with a second logic gate 188 for freezing the content of third register 152. Second logic gate 188 has a first input coupled to the decoder 170 or a second further pin not shown from the plurality of pins 160 for receiving a further update signal, e.g. a data register update signal. The second logic gate 188 has a second input coupled to the output of the plurality of logic gates 180 that provides the gating signal. The output of the second logic gate 188 is coupled to the third register 152. This way, not only the content of second register 144 but also the content of third register 152 is frozen in between the consecutive further update signals, which can be of importance if the state of the module 100 is primarily defined by the contents of second register 144 and third register 152. It is emphasized that the further update signal may be the same as the update signal. This particular embodiment of the test controller enables the masking of activity on data registers that are controlled by the test controller 140, or more specifically, the decoder 170. This is an important advantage in situations where actions, e.g. state changes, in a module 100 having a non-active or non-addressed decoder 170, e.g. a TAP controller, are undesirable because they have an interfering effect with the evaluations of other modules.

Figure 4:
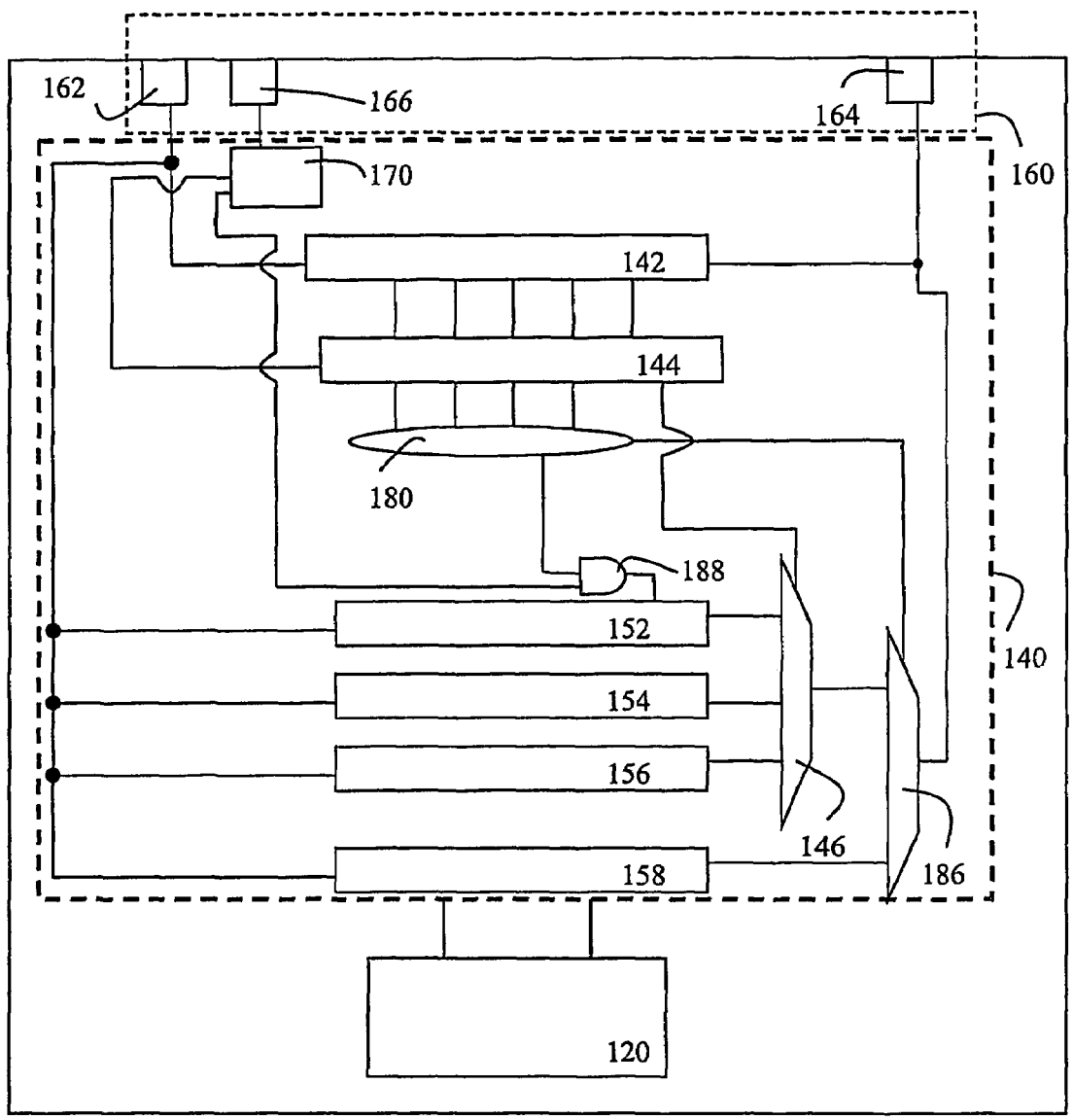
FIG. 4 depicts yet another embodiment of a module according to the present invention.

FIG. 4 is described in backreference to FIG. 3 and its detailed description. In the embodiment shown in FIG. 4, the inputs of the plurality of logic gates 180 are coupled to the outputs of second register 144. In this arrangement, only the content of the third register 152 is frozen during the encounter of a bit pattern in second register 144 indicating a no-update action of the third register 152. Such an arrangement is useful when the second register 144 is not used to directly control the debugging of module 100, for masking any actions from the module 100 that are triggered by a change in the content of the third register 152.

Figure 5:
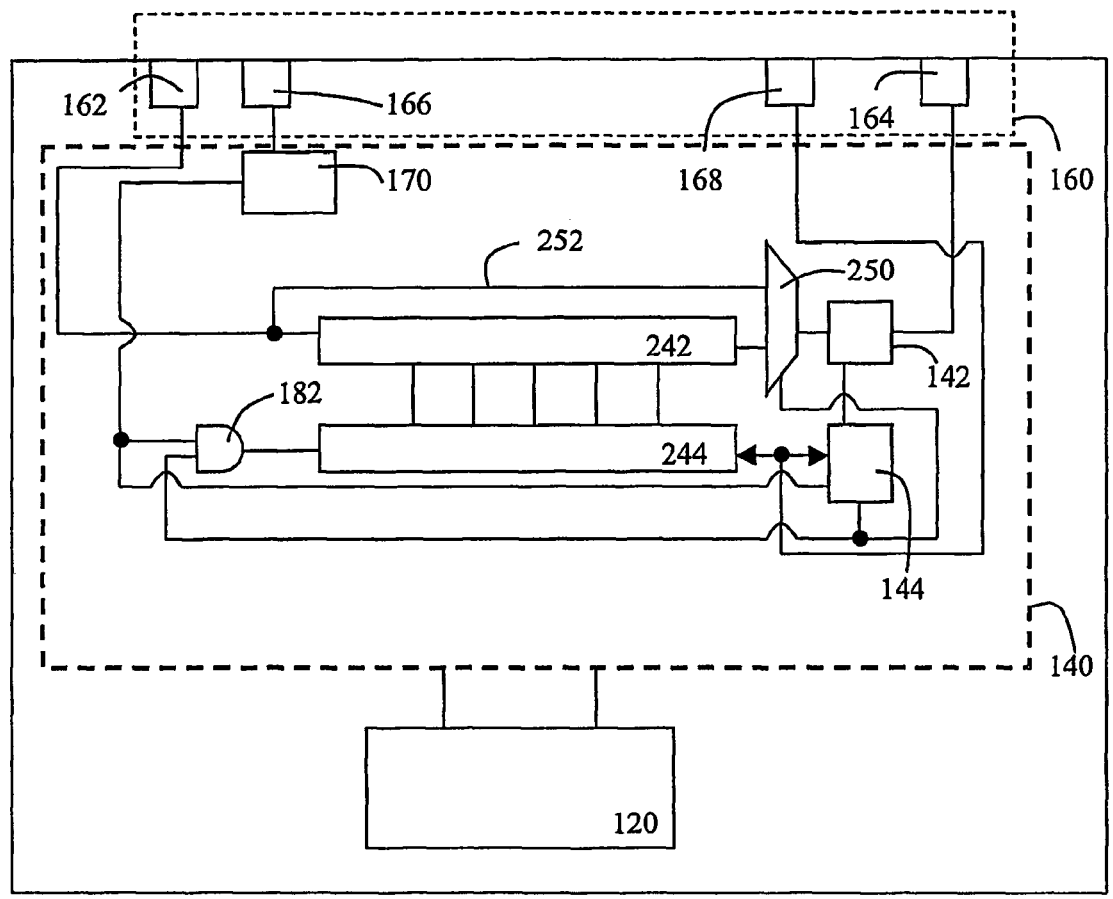
FIG. 5 depicts a further embodiment of a module according to the present invention.

FIG. 5 is described in backreference to the previous Figs. and their detailed description. A further embodiment of the present invention is shown in FIG. 5. Here, first register 142 serves as a bypass register for first further register 242. The input of the first register 142 is coupled to the output of the first further register 242 via a first input of a further multiplexer 250. Multiplexer 250 has a second input coupled directly to the data input 162, thus effectively bypassing the first further register 242 via a bypass route 252. Second register 144 serves as an update register for this first register 142. First further register 242, which may be a data shift register or an instruction shift register, is coupled to a second further register 244, which serves as an update register for first further register 242. Second further register 244 typically generates the evaluation control signals 145 depicted in FIG. 1. Second further register 244 is responsive to an update signal that is generated by decoder 170 or is received via a further pin not shown from the plurality of pins 160. Optionally, second register 144 is also responsive to this reset signal, as indicated in FIG. 5. An output of the second register 144 is coupled to both the control terminal of further multiplexer 250 as well as to the second input of the first logic gate 182, with the first input of the first logic gate 182 being arranged to receive the update signal, and the output of the first logic gate 182 being coupled to the second further register 244.

Initially, the bit patterns that are shifted into the test controller 140, e.g. into the first further register 242 concatenated with first register 142, will include a bit pattern that resides in the first register 142 prior to an update of the bit pattern from the first register 142 to the second register 144. Preferably, this bit pattern consists of a single bit, and first register 142 and second register 144 are single-bit registers. Simultaneously, the bit patterns include a further bit pattern that will reside in first further register 242 prior to the update of the further bit pattern to second further register 244. The bit pattern that is updated into second register 144 controls the gating of the second further register 244 and the path through further multiplexer 250. With an appropriate bit pattern, e.g. a logic '0', the bypass route 252 is chosen and the update of second further register 244 is prevented at the next update cycle. This behavior will be continued as long as the first register 142 contains the appropriate bit pattern prior to every next update cycle. As soon as reset bit pattern, e.g. a logic '1', is updated from the first register 142 to the second register 144, the first further register 242 will be included again in the path between the input pin 162 and the output pin 164, and the second further register 244 will be updated again in the next update cycle.

Optionally, the second register 144 and the further second register 244 are responsive to a reset signal via a further pin 168 from the plurality of pins 160 for bringing them in an initial state. This may prevent unwanted behavior of module 100 during initialization of the evaluation mode. The main advantage of the embodiment shown in FIG. 5 is that during evaluation of a further module, the first further register 242, which operates as a shift register, can be replaced by a fixed size, e.g. single-bit, first register 142 acting as a bypass register without the need of an additional pin for receiving a bypass control signal or additional bypass controller. This effectively reduces the length of the total scan chain through the modules of an electronic device, which enables an increase in the number of bit patterns that can be fed to a module under evaluation during a given period of time. Also, because the first register 142 is of a fixed size, the development of evaluation tools for other modules has become more facile, because during evaluation of the other module, the evaluation tool can simply load a standard bypass instruction into the first register 142 of module 100, thus freezing its state by gating the update of second further register 244. This improves the reliability of the evaluation of the module under evaluation. It is emphasized that the content of second register 144 additionally may be used as a test control signal 145. In that case, the second register 144 can be seen as an ungateable extension to second further register 244. This has the advantage that the test address space of the test controller 140 is increased, which increases the number of test modes that can be selected when the content of the second further register 244 is kept stable.

Figure 6:
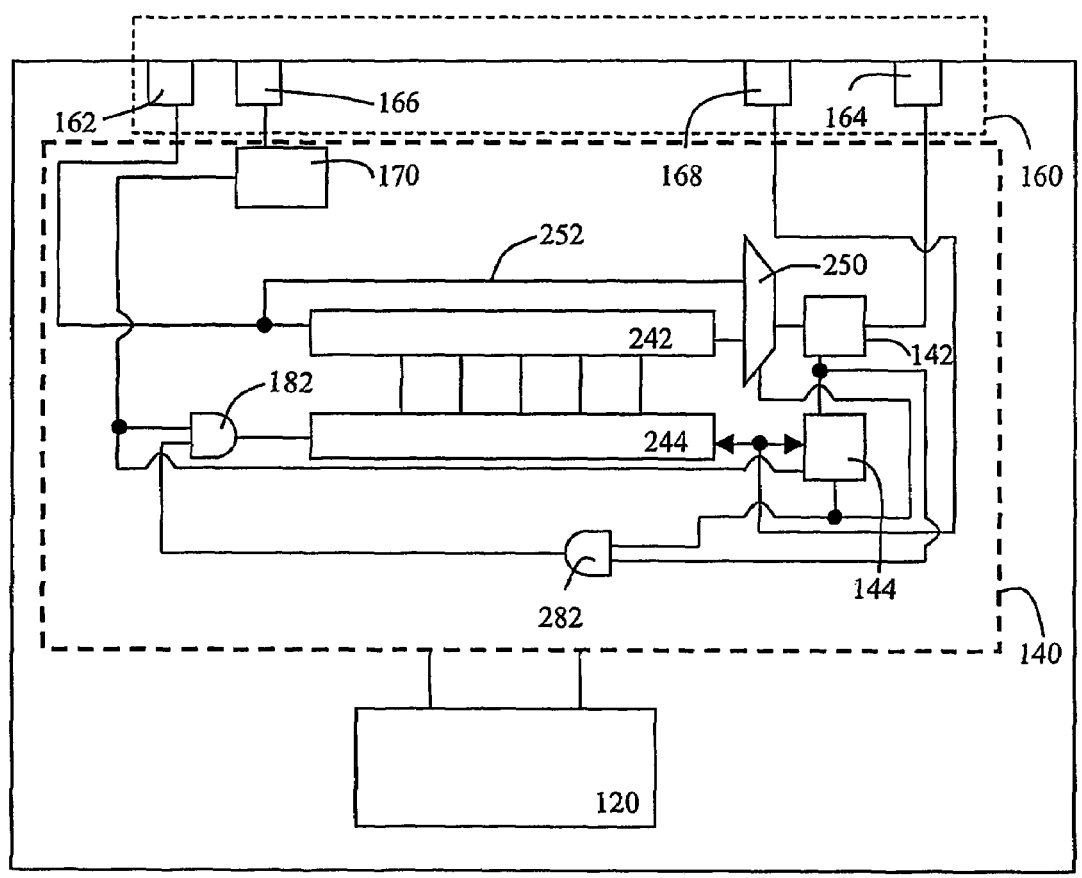
FIG. 6 depicts yet a further embodiment of a module according to the present invention.

FIG. 6 is described in backreference to FIG. 5 and its detailed description. In FIG. 6, the embodiment shown in FIG. 5 has been extended with a further logic gate 282. The further logic gate 282 is arranged to provide the first logic gate 182 with a modified gating signal for holding the content of second further register 244. To this end, further logic gate 282 has a first input coupled to an output of the first register 142 and a second input coupled to an output of the second register 144. The output of the further logic gate 282 is coupled to the second input of the first logic gate 182. This arrangement allows for the holding of the content of the second further register 244 that was loaded prior to the loading of the bit pattern including the bypass opcode, which allows for a greater flexibility in the holding of bit patterns in second further register 244.

Figure 7:
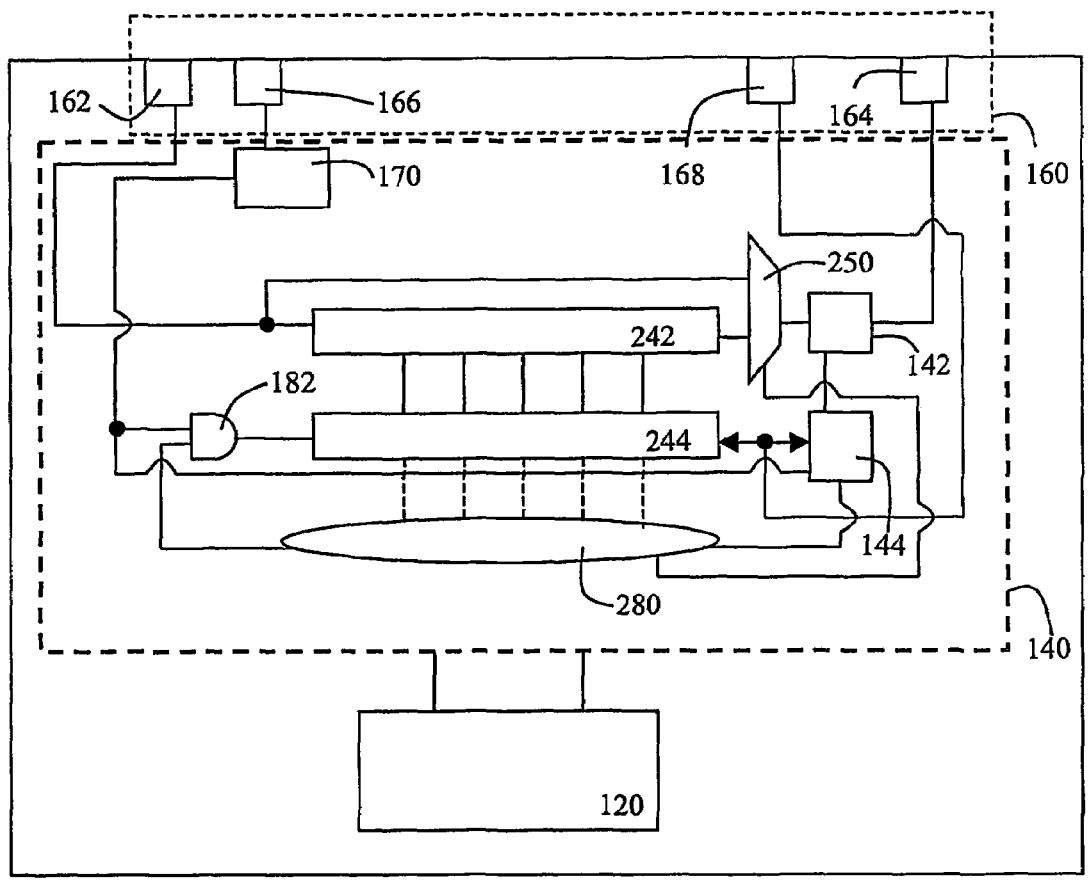
FIG. 7 depicts yet a further embodiment of a module according to the present invention.

FIG. 7 is described in backreference to FIG. 6 and its detailed description. In the embodiment depicted in FIG. 7, the outputs of second further register 244 are coupled to a plurality of logic gates 280 being responsive to the content of second register 144. The plurality of logic gates 280 serves as a decoder of the bit pattern stored in second register 144, in order to generate a decoded bit pattern, i.e. a bit pattern in a modified form, which is used to control multiplexer 250 and, as an option, to generate the gating signal for first logic gate 182. The presence of dedicated decoding logic responsive to a bit pattern has the advantage that a larger number of test modes can be covered, because the test addressing space is enlarged.

It is pointed out that the exemplary embodiments shown in FIGS. 5-7 can be extended with at least an additional register under control of second further register 244 for defining a fixed path through test controller 140 in analogy with the teachings of FIGS. 2-4 and their detailed description. It is emphasized that such arrangements, i.e. selecting a register through a test controller 140 by controlling a multiplexer with at least a part of the content of second further register 244, are known per se from boundary scan test controllers.

Figure 8:
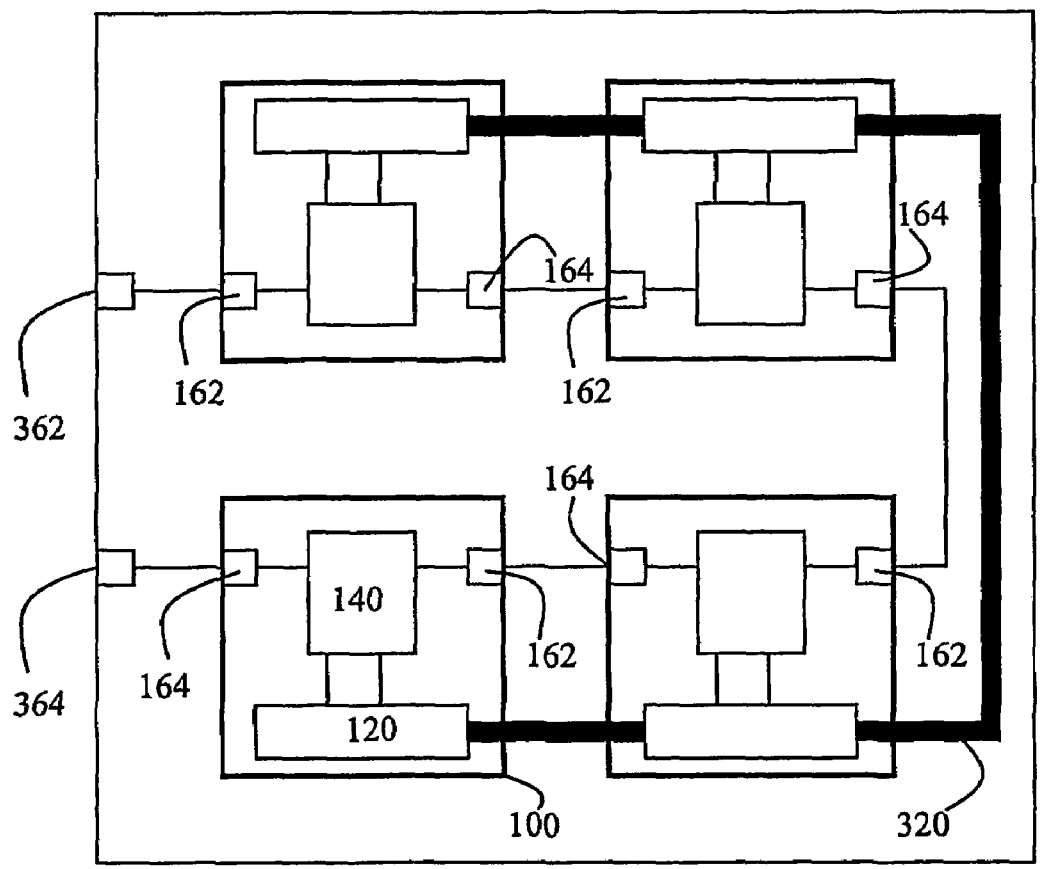
FIG. 8 depicts an electronic device according to the present invention.

FIG. 8 shows an electronic device 300 carrying four modules 100 with test controllers 140 according to the present invention. In an evaluation mode, the modules 100 are interconnected via input connection 362 and output connection 364 of the electronic device and the respective input pins 162 and output pins 164 of the modules 100. In a normal mode, the respective functional blocks 120 of modules 100, which may be four different functional blocks 120, are coupled to each other via a data communication network 320, e.g. point-to-point hardwired interconnections, a data communication bus, a combination of the two or other well-known data communication architectures.

It will be obvious to those skilled in the art that not all modules 100 of electronic device 300 need to be modules according to the present invention, although this should preferably be the case for maximization of the advantages of the present invention.

The use of test controllers 140 according to the present invention in the modules 100 of electronic device 300 has the advantage that each of the modules 100 can be kept in a stable state, e.g. a functional state or dedicated test or debug state, during evaluation, e.g. test or debug, of one of the other modules 100. In addition, a bypass route through each of the modules 100 can be chosen while maintaining the module 100 is a stable state. This has the advantage that the evaluation result of the electronic device 300 can become more reliable and the evaluation can become more extensive, which leads to an electronic device 300 that has less chance of being marketed with undiscovered errors on-board. In addition, the modules of the present invention can lead to shorter evaluation times, which reduces the cost of the electronic device 300.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A module comprising a functional block and a test controller for controlling the functional block in an evaluation mode of the module, the test controller comprising:
   a plurality of pins including an input pin and an output pin;
   a first register coupled between the input pin and the output pin for receiving a bit pattern via the input pin and outputting the bit pattern via the output pin; and
   a second register coupled to the first register for capturing the bit pattern responsive to an update signal;
   dedicated control circuitry for blocking the update signal responsive to the bit pattern;
   a multiplexer; and
   a no-update bypass register configured with the multiplexer in response to a no-update code, to maintain the bit pattern in a stable state for the evaluation mode.

2. A module as claimed in claim 1, characterized in that the dedicated control circuitry comprises a first logic gate having:
   a first input for receiving the update signal;
   a second input coupled to the first register for receiving the bit pattern; and
   an output coupled to the second register.

3. A module as claimed in claim 2, characterized in that the dedicated control circuitry further comprises a plurality of logic gates coupled between the first register and the second input of the first logic gate for providing the second input with the bit pattern in a modified form.

4. A module comprising a functional block and a test controller for controlling the functional block in an evaluation mode of the module, the test controller comprising:
   a plurality of pins including an input pin and an output pin;
   a first register coupled between the input pin and the output pin for receiving a bit pattern via the input pin and outputting the bit pattern via the output pin; and
   a second register coupled to the first register for capturing the bit pattern responsive to an update signal;
   dedicated control circuitry for blocking the update signal responsive to the bit pattern;
   a first logic circuit for receiving the update signal and for receiving the bit pattern and being coupled to the second register;
   a multiplexer having a control terminal, a first input, a second input, and an output coupled to the output pin;
   a third register coupled between the input pin and the first input of the multiplexer; and
   a no-update bypass register coupled between the input pin and the second input of the multiplexer;
   the control terminal of the multiplexer being responsive to at least a part of the bit pattern.

5. A module as claimed in claim 4, characterized in that the dedicated control circuitry comprises a second logic gate having:
   a first input coupled to the plurality of logic gates for receiving the bit pattern in the modified form;
   a second input for receiving a further update signal; and
   an output coupled to the third register, the third register being responsive to the further update signal.

6. A module as claimed in claim 4, characterized in that an output path of the plurality of logic gates comprises a data storage element responsive to the update signal for storing the bit pattern in the modified form.

7. A module comprising a functional block and a test controller for controlling the functional block in an evaluation mode of the module, the test controller comprising:
   a plurality of pins including an input and an output pin;
   a first register coupled between the input pin and the output pin for receiving a bit pattern via the input pin and outputting the bit pattern via the output pin; and
   a second register coupled to the first register for capturing the bit pattern responsive to an update signal;
   dedicated control circuitry for blocking the update signal responsive to the bit pattern;
   a first logic circuit for receiving the update signal and for receiving the bit pattern and coupled to the second register;
   a multiplexer having a first input, a second input, an output and a control terminal coupled to an output of the second register;
   a first further register coupled between the input pin and the first input of the multiplexer;
   a second further register being responsive to the update signal, the second further register having at least an input coupled to the first further register; and a conductor coupled between the input pin and the second input of the multiplexer;
   the first register being coupled between the output of the multiplexer and the output pin; and
   the second input of the first logic gate being coupled to the first register via the second register.

8. A module as claimed in claim 7, characterized in that the second further register is responsive to a reset signal.

9. A module as claimed in claim 7, characterized in that the second input of the first logic gate is coupled to the second register through a further logic gate, the further logic gate further being coupled to the first register.

10. A module as claimed in claim 7, characterized in that the dedicated control circuitry further comprises a plurality of logic gates being responsive to the bit pattern in the second register, the plurality of logic gates having their inputs coupled to the second further register and having at least an output coupled to the control terminal of the multiplexer.

11. An electronic device comprising a plurality of modules being substantially serially interconnected in an evaluation mode through respective input pins and output pins, a module from the plurality of interconnected modules comprising a functional block and a test controller for controlling the functional block in the evaluation mode of the module, the test controller comprising:
   a plurality of pins including an input pin from the respective input pins and an output pin from the respective output pins;
   a first register coupled between the input pin and the output pin for receiving a bit pattern via the input pin and outputting the bit pattern via the output pin; and a second register coupled to the first register for capturing the bit pattern responsive to an update signal;
   a by-pass register and a multiplexer for directing data to the output pin;
   dedicated control circuitry for blocking the update signal responsive to the bit pattern and providing data-path stability for the evaluation mode.

12. An evaluation tool comprising a set of bit patterns for evaluating an electronic device as claimed in claim 11 by providing the electronic device with the set of bit patterns, characterized in that the set of bit patterns comprises a bit pattern for triggering the control circuitry to block the update signal responsive to the bit pattern.

13. A test controller circuit for controlling a functional block in an evaluation mode, the test controller comprising:
   a plurality of pins including an input pin and an output pin;
   a multiplexer having a first input, a second input, an output coupled to the output pin, and a control terminal responsive to at least a part of the bit pattern;
   a no-update bypass register coupled between the input pin and the second input of the multiplexer;
   a first register, coupled between the input pin and the output pin, to receive a bit pattern via the input pin and to output the bit pattern via the output pin; and
   a second register, coupled to the first register, to capture the bit pattern responsive to an update signal;
   a third register coupled between the input pin and the first input of the multiplexer; and
   dedicated control circuitry to block the update signal responsive to the bit pattern, the control circuitry including
      a first logic gate having a first input for receiving the update signal, a second input coupled to the first register for receiving the bit pattern, and an output coupled to the second register, and
      a plurality of logic gates coupled between the first register and the second input of the first logic gate for providing the second input with the bit pattern in a modified form.

14. The circuit of claim 13, wherein the dedicated control circuitry includes a second logic gate having
   a first input coupled to the plurality of logic gates for receiving the bit pattern in the modified form,
   a second input for receiving a further update signal, and
   an output coupled to the third register, the third register being responsive to the further update signal.

15. The circuit of claim 14, further including a data storage element that is coupled to an output of the plurality of logic gates and that is responsive to the update signal for storing the bit pattern in the modified form.

16. The circuit of claim 13, further including a data storage element that is coupled to an output of the plurality of logic gates and that is responsive to the update signal for storing the bit pattern in the modified form.

* * * * *